(12) United States Patent
Mitros

(10) Patent No.: US 6,660,603 B2
(45) Date of Patent: Dec. 9, 2003

(54) HIGHER VOLTAGE DRAIN EXTENDED MOS TRANSISTORS WITH SELF-ALIGNED CHANNEL AND DRAIN EXTENSIONS

(75) Inventor: Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/952,404

(22) Filed: Sep. 14, 2001

(65) Prior Publication Data

US 2002/0055233 A1 May 9, 2002

Related U.S. Application Data

(60) Provisional application No. 60/234,277, filed on Sep. 21, 2000.

(51) Int. Cl.$^7$ ............................................. H01L 21/336
(52) U.S. Cl. .................. 438/303; 438/303; 438/306; 438/301; 438/302
(58) Field of Search .................. 438/202, 203, 438/223, 224, 231, 232, 519, 527, 549, 301, 302, 303, 305, 177, 180, 227, 225, 306, 517

(56) References Cited

U.S. PATENT DOCUMENTS

| 5,747,850 A | 5/1998 | Mei |
| 5,903,032 A | 5/1999 | Duvvury |
| 6,071,768 A | 6/2000 | Duvvury et al. |
| 6,096,609 A | * 8/2000 | Kim et al. .................. 438/281 |
| 6,100,125 A | * 8/2000 | Hulfachor et al. .......... 438/224 |

* cited by examiner

Primary Examiner—Olik Chaudhuri
Assistant Examiner—Julio J. Maldonado
(74) Attorney, Agent, or Firm—Peter K. McLarty; W. James Brady III; Frederick H.. Telecky, Jr.

(57) ABSTRACT

An integrated circuit drain extension transistor. A transistor gate (72) is formed over a CMOS n-well region (10). A transistor source extension region (50), and drain extension region (52) are formed in the CMOS well region (10). A transistor region (90) is formed in the source extension region 50 and a transistor drain region 92 is formed between two drain alignment structures (74), (76) in the drain extension region (52).

12 Claims, 4 Drawing Sheets

HIGHER VOLTAGE DRAIN EXTENDED MOS TRANSISTORS WITH SELF-ALIGNED CHANNEL AND DRAIN EXTENSIONS

This application claims priority under 35 USC §119(e)(1) of provisional application Ser. No. 60/234,277, filed Sep. 21, 2000.

FIELD OF THE INVENTION

The invention is generally related to the field of MOSFET transistors and more specifically to an integrated high voltage drain extended transistor.

BACKGROUND OF THE INVENTION

In integrated circuits there is often the need to have a number of different operating voltages. Circuits that use transistors with gate lengths less than 0.25 um typically operate at voltages less than 2.5 volts. For input-output operations (i.e., connection to circuits external to the chip) longer gate length transistors (>0.3 um) typically operate at about 2.5V to 3.3V. In some instances such as disk drive controllers, the circuits might require a 5 volt signal. In these cases, transistors capable of operating at high voltages are required. A transistor suitable for use at high voltages in integrated circuits is a drain extended (DE) transistor. Drain extended transistors may also be used in applications where the voltage on the drain exceeds the normal voltage rating of the gate oxide. Drain extended transistors differ from regular self aligned polysilicon gate transistors in that they use a very lightly doped extension region adjacent to the drain that depletes at high drain voltages. This allows much of voltage to be dropped across the silicon, reducing the electric field across the gate oxide to a safe level. Drain extended transistors allow operation at several times the rated voltage of core transistors, can handle analog signals of several volts, are suitable for power amplifiers and power conditioning circuits, and are generally more robust than conventional transistors having the same thickness of gate oxide. In particular, it is not necessary to add extra drain implants to control channel hot carrier (CHC) effects, and the higher breakdown voltage simplifies electrostatic discharge (ESD) protection; for example it is not normally necessary to include the resistors commonly required in series with application specific integrated circuits (ASIC) outputs.

Typically, to incorporate DE transistors into a CMOS integrated circuit, additional and special processes are required. These processes usually add cost and complexity to producing the integrated circuit. In the instant invention, DE transistor structures and processing methods are described that allow the incorporation of high voltage DE transistors into integrated circuits without introducing added processing complexity. In addition, DE transistors typically have a long channel length to avoid short channel effects and low BVdss when the polysilicon gate is mis-aligned or the polysilicon gate does not properly overlap the well structures in the substrate. The instant invention describes a double self-aligned process the allows DE transistors to fabricated with channel lengths on the order of the critical photolithography dimensions.

SUMMARY OF THE INVENTION

The integrated DE transistor structures described herein according to the instant invention can be fabricated using technology suitable for fabricating MOS transistors with sub micron gate lengths. In particular, a method for forming a drain extension transistor comprises the following: providing a semiconductor substrate with a plurality of isolation structures and a first well region of a first conductivity type; forming a masking layer on a first area of said first well region; implanting said first well region to form regions of a second conductivity type in said first well region adjacent to said masking layer; removing said masking region; forming a gate dielectric on said first well region; forming a gate layer on said gate dielectric; patterning said gate layer to form a gate structure and drain alignment structures such that said gate structure overlies a portion of said first well region and a portion of said regions of said second conductivity type; forming a patterned film to mask an area between said gate structure and said drain alignment structures; and simultaneously forming a source region and a drain region in said regions of said second conductivity type.

In addition to the above described method the plurality of isolation structures are LOCOS or STI. The masking layer comprises photoresist and the gate dielectric comprises a material selected from the group consisting of an oxide, thermally grown SiO2, a nitride, an oxynitride, a silicate, and any combination thereof.

BRIEF DESCRIPTION OF THE DRAWINGS

In the drawings:

FIG. 1A–FIG. 4D are cross-section diagrams illustrating various embodiments of the instant invention.

Figure 1:
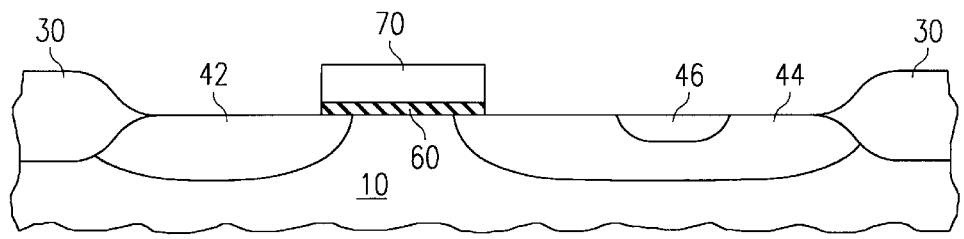

Common reference numerals are used throughout the figures to represent like or similar features. The figures are not drawn to scale and are merely provided for illustrative purposes.

DETAILED DESCRIPTION OF THE DRAWINGS

The following description of the instant invention revolves around FIGS. 1–4. The methodology of the instant invention provides a solution to integrating high voltage DE transistors and core CMOS transistors in the same integrated circuit chip using CMOS processes suitable for fabricating sub micron gate length transistors.

The following description of the instant invention will be related to FIGS. 1–4. A typical cross-section of a DE transistor is shown in FIG. 1. A p-type silicon substrate region 10 is provided and isolation structures 30 are formed in the substrate 10. The isolation can be local oxidation (LOCOS) structures, shallow trench isolation (STI), or any other suitable integrated circuit isolation scheme. LOCOS structures are formed by first depositing an oxide and nitride films which are then patterned and etched to expose areas in the substrate where the isolation structure is required. The substrate is then oxidized to form the isolation structures. STI structures are formed by first etching a trench in the substrate which is then filled with an insulator. This insulator can be silicon oxide, silicon nitride, or any insulating material with suitable properties. A gate dielectric 60 is formed on the substrate 10. The gate dielectric 60 may be comprised of an oxide, thermally grown SiO2, a nitride, an oxynitride, or any combination thereof. A layer of conductive material (which will be patterned and etched to form gate structure 70) is formed on gate dielectric 60. Preferably, this conductive material is comprised of polycrystalline silicon ("poly" or "polysilicon"), but it may be comprised of epitaxial silicon or any other semiconducting material. The DE transistor contains a source 42 and a drain region 46 and a lightly doped drain extension 44. For the case of a p-type substrate region 10, the source region 42 and the drain region 46 will be doped n-type. The very lightly doped drain extension 44 will also be doped n-type but will have a dopant concentration much less than that of the source region 42 and the drain region 44. The doping concentration of the very lightly doped drain extension is chosen such that it will deplete when the drain voltage increases.

A twin well process is used to fabricate most CMOS circuits. In this process, a n-type well (n-well) region is formed in the substrate in which a PMOS transistor will be formed. A p-type well (p-well) region is also formed in the substrate in which a NMOS transistor is fabricated. The n-well and p-well regions are formed by implanting n-type and p-type dopant species into the substrate respectively. In addition to the well implants, a number of additional implants are required to fabricate CMOS integrated circuits. These include n-type and p-type punch through implants for reducing transistor off current, n-type and p-type channel stop implants for reducing isolation leakage, n-type and p-type threshold adjust implants for setting the NMOS and PMOS transistor threshold voltages, and n-type and p-type pocket implants for reducing threshold voltage roll-off. In both types of wells, the threshold adjust implant is the shallowest. The punch through implant is the next deepest, and provides a higher concentration at a greater depth to increase the source to drain punch through breakdown voltage, with only a small concentration near the surface and with only a small effect on the threshold voltage. The third implant is channel stop, is deeper still and provides a sufficient doping concentration under the STI or field oxide to prevent inversion. The fourth implant is the retrograde well implant providing the highest concentration at the greatest depth. The following table lists some typical implant conditions for CMOS process:

| | Dose (cm2) | Species | Energy (keV) |
|---|---|---|---|
| p-type threshold voltage adjust | $1 \times 10^{12} - 4 \times 10^{12}$ | BF3 or B | 5–25 |
| | $2 \times 10^{12} - 8 \times 10^{12}$ | BF3 or B | 20–100 |
| | $2.5 \times 10^{12} - 7 \times 10^{12}$ | BF3 or B | 150–350 |
| p-well implant | $2 \times 10^{13} - 8 \times 10^{13}$ | Boron | 20–100 |
| n-type threshold voltage adjust | $1 \times 10^{12} - 4 \times 10^{12}$ | Phosphorous | 30–80 |
| | $3 \times 10^{12} - 8 \times 10^{12}$ | | 100–300 |
| n-well implant | $2 \times 10^{13} - 6 \times 10^{13}$ | Phosphorous | 100–400 |
| n-type source-drain | $1 \times 10^{15} - 5 \times 10^{15}$ | Arsenic | 50–290 |
| | $1 \times 10^{14} - 5 \times 10^{14}$ | phosphorous | 35–150 |
| p-type source-drain | $1 \times 10^{15} - 4 \times 10^{15}$ | Boron | 5–50 |

In CMOS processes, the n-well and the p-well can contain any combination of well and threshold adjust implants. In the following description of the various embodiments of the instant invention, the names given to the various regions of the DE transistors are functional names that describe the function of the various implants in the core CMOS circuit. Unless otherwise stated, the above implant table represents typical implant conditions that can be used to form the various structures of the instant invention. Other implant conditions can be used to form the DE transistors described in the instant invention without departing from the scope of the invention.

Figure 2A:
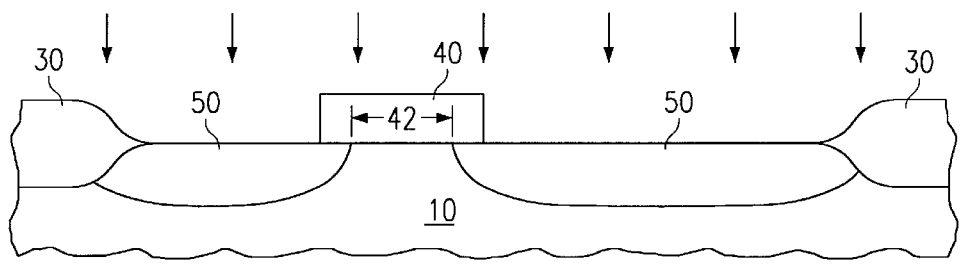
Figure 2B:
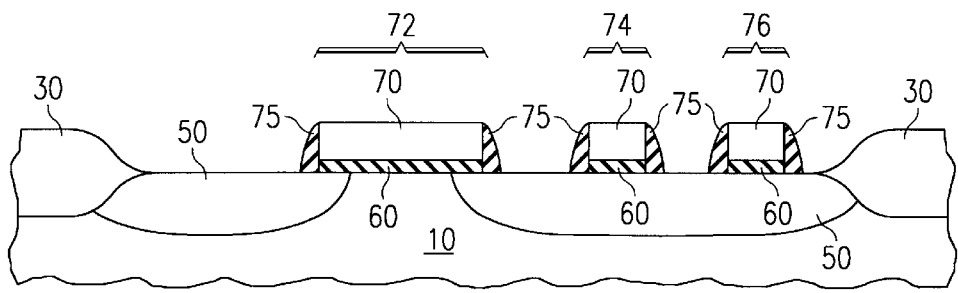
Figure 2C:
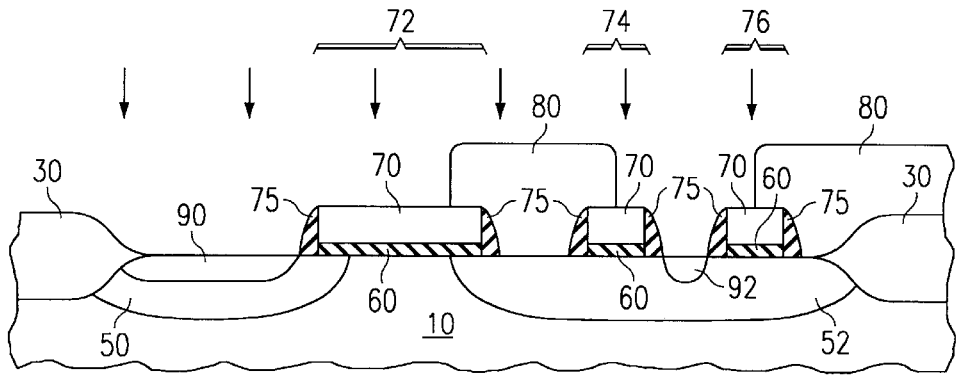

Shown in FIGS. 2A–2C are cross-sections of a DE-NMOS transistor fabrication process according to an embodiment of the instant invention. Here the silicon substrate will contain other CMOS transistors (not shown) fabricated in other region of the substrate. These CMOS transistors represent core transistors and can have operating voltages less than that of the DE transistors. The DE transistor represented in FIGS. 2A–2C will have an operating voltage greater than that of the core transistors. The DE transistor will be simultaneously fabricated with the core transistors using many of the same processes. The fabrication process of the DE transistor will be described with respect to the function of the particular process in the core transistor fabrication sequence. The structure shown in FIG. 2A is formed in an p-well region 10. The isolation structures 30 are formed using LOCOS processing technology and comprises silicon oxide or other suitable dielectrics. The oxide thickness is about 4000–7000A and the layout of the isolation structures 30 shown in FIG. 2A is defined by the photolithographic process used during nitride film patterning. The core transistor fabrication process used here is a twin well process. This requires that an n-type region and a p-type region be formed in the substrate for fabrication of the core PMOS and NMOS transistors respectively. During the p-well formation for the core transistors, region 10 is formed. For a typical CMOS processes the p-well is formed by the implantation of any number of p-type dopant species into the substrate to form the p-well region 10. In an embodiment of the p-well process, boron ions are implanted at doses of $2 \times 10^{12}$ cm$^2$ to $7 \times 10^{13}$ cm$^2$ at energies of about 40 keV. Standard photolithographic processes can be used to define region 10. Following the formation of the p-well region 10, a masking layer 40 is formed to act as an implant mask during the subsequent implantation step. In an embodiment of the instant invention, a patterned photoresist film is used. Any film suitable for masking the subsequent implant process can be used. During the n-well formation for the core CMOS transistors, regions 50 and 52 are formed. For a typical CMOS processes, the n-well (and simultaneously regions 50 and 52) can be formed by implanting any number of n-type dopant species into the p-well substrate region 10. In one embodiment, this could comprise implantation of a phosphorous species at about $8 \times 10^{12}$ cm$^2$ to $7 \times 10^{13}$ cm$^2$ at an energy of about 150 keV. The width of the photoresist mask 42 defines the channel length of the DE transistor and can be controlled to an accuracy defined by the limits of the photolithographic process. The process of using a photolithographic mask to define the channel length of the transistor represents the first self-aligned process of the instant invention. Following the removal of the photoresist mask, a gate dielectric 60 is formed on the p-well region 10. The gate dielectric 60 may be comprised of an oxide, thermally grown SiO2, a nitride, an oxynitride, a silicate, or any combination thereof, and is preferably on the order of 1 to 5 nm thick. The gate dielectric can be formed simultaneously for the core CMOS transistors and the DE transistors or it can be separately formed using a split gate process. A gate layer 70 is formed on gate dielectric 60. Preferably, this gate layer is comprised of polycrystalline silicon ("poly" or "polysilicon"), but it may be comprised of epitaxial silicon or any other semiconducting material or metal. This polycrystalline material will be patterned and etched to define a transistor gate structure 72 and drain alignment structures 74 and 76 as shown in FIG. 2B. In an embodiment of the instant invention, the drain alignment structure 74, 76 can comprise a ring structure. The gate of the DE transistor 72 is positioned such that it overlaps the n-well implanted regions 50 and the p-well region 10. Sidewall spacer structures 75 are formed using silicon dioxide, silicon nitride or other similar materials. The spacers 75 are formed by first forming a blanket film on the surface of the substrate followed by an anisotropic etch. The sidewall spacers for the DE transistor 75 are formed simultaneously with the sidewall spacers of the core transistors. The drain and source regions of the DE transistor are defined by first forming a patterned photoresist film 80 as shown in FIG. 2C. This patterned film can be formed during the N+ source and drain pattern step for the core NMOS transistor. The alignment of this patterned resist film 80 to the gate and drain alignment structures 72, 74, and 76 is not critical since any misalignment that occurs will be compensated by the widths of the gate and drain alignment structures 72, 74, and 76. The DE transistor source 90 and drain 92 regions are then formed during the N+ implantation process used to form the source and drain regions for the core NMOS transistor. The position of the source region is self-aligned to the edge of the gate structure 72 (including sidewall spacers 75) and the position of the drain is self-aligned by the drain alignment structures (including sidewall spacers 75). This alignment of the source and drain regions 90, 92 represents the second self-aligned step of the instant invention. Following the removal of the patterned photoresist film 80, the DE transistor is completed using standard semiconductor processing. In addition to the processes described above any number of additional implants could be added to the process. In some CMOS technologies pocket implants, channel stop implants, and punch through implants are used. One or more of these processes could be used in the fabrication of the DE transistor of the instant invention without departing from the scope of the instant invention. In the DE transistor structure shown in FIG. 2C, the n-well region 52 functions as the lightly doped drain extension region surrounding the heavily doped n-type drain region 92. The region 50 functions as a source extension region which surrounds the heavily doped n-type source region 90. This source extension region functions to reduce the electric field in regions of the gate 72 close to the source. The separation of the source region 90 and the drain region 92 is defined by the separation of the gate region 72 and the drain alignment structures 74 and 76. This separation will be controllable to within the limits of the photolithographic processes and the etch processes used to define the gate region 72 and drain alignment regions 74, 76.

Figure 3A:
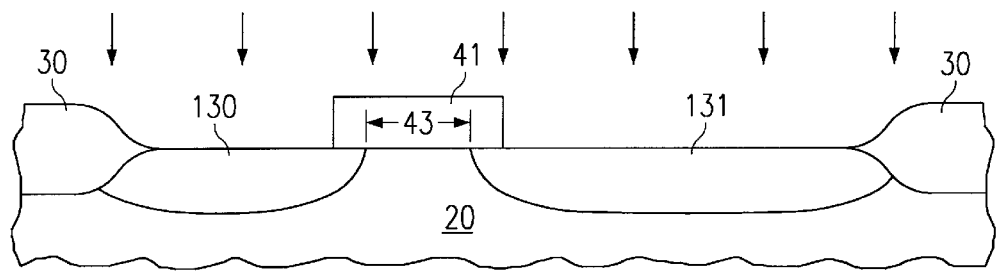
Figure 3B:
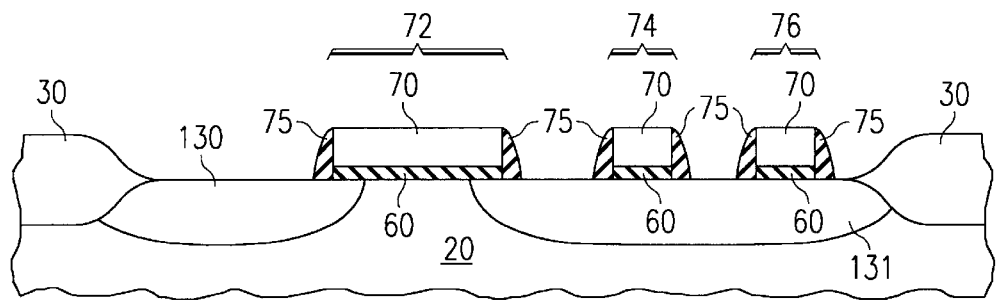
Figure 3C:
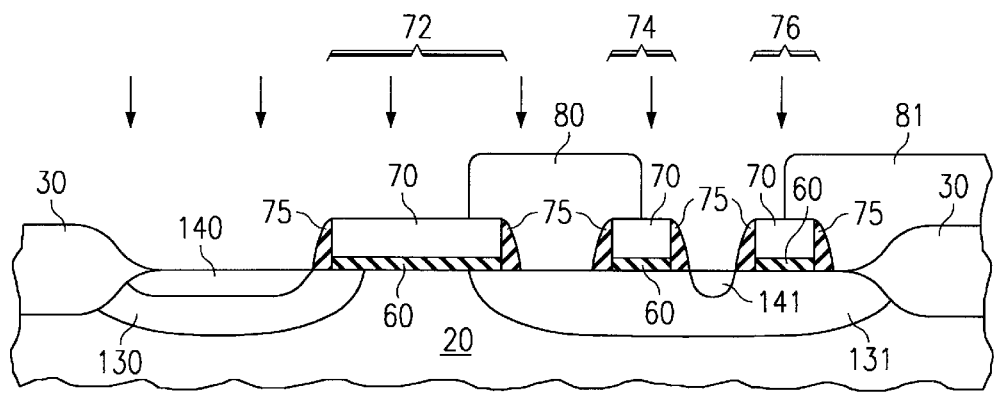

Shown in FIGS. 3A–3C are cross-sections of a DE-NMOS transistor fabrication process according to another embodiment of the instant invention. Here the silicon substrate will contain other CMOS transistors (not shown) fabricated in other region of the substrate. These CMOS transistors represent core transistors and can have operating voltages less than that of the DE transistors. The DE transistor represented in FIGS. 3A–3C will have an operating voltage greater than that of the core transistors. The DE transistor will be simultaneously fabricated with the core transistors using many of the same processes. The fabrication process of the DE transistor will be described with respect to the function of the particular process in the core transistor fabrication sequence. The structure shown in FIG. 3A is formed in an n-well region 20. The isolation structures 30 are formed using LOCOS processing technology and comprises silicon oxide or other suitable dielectrics. The oxide thickness is about 5000–7000A and the layout of the isolation structures 30 shown in FIG. 3A is defined by the photolithographic process used during nitride film patterning. The core transistor fabrication process used here is a twin well process. This requires that an n-type region and a p-type region be formed in the substrate for fabrication of the core PMOS and NMOS transistors respectively. During the n-well formation for the core transistors, region 20 is formed. For a typical CMOS processes the n-well is formed by the implantation of any number of n-type dopant species into the substrate to form the n-well region 20. In an embodiment of the n-well process, phosphorous ions are implanted at doses of $2 \times 10^{12}$ cm$^2$ to $7 \times 10^{13}$ cm$^2$ at energies of about 150 keV. Standard photolithographic processes can be used to define region 20. Following the formation of the n-well region, a masking layer 41 is formed to act as an implant mask during the subsequent implantation step. In an embodiment of the instant invention, a patterned photoresist film is used. Any film suitable for masking the subsequent implant process can be used. During the p-well formation for the core CMOS transistors, regions 130 and 131 are formed. For a typical CMOS processes, the p-well (and simultaneously regions 130 and 131) can be formed by implanting any number of p-type dopant species into the substrate 20. In one embodiment, this could comprise implantation of a boron species at about $8 \times 10^{12}$ cm$^2$ to $7 \times 10^{13}$ cm$^2$ at an energy of about 40 keV. The width of the photoresist mask 43 defines the channel length of the DE transistor and can be controlled to an accuracy defined by the limits of the photolithographic process. The process of using a photolithographic mask to define the channel length of the transistor represents the first self-aligned process of this embodiment of the instant invention. Following the removal of the photoresist mask, a gate dielectric 60 is formed on the n-well region 20. The gate dielectric 60 may be comprised of an oxide, thermally grown SiO2, a nitride, an oxynitride, a silicate, or any combination thereof, and is preferably on the order of 1 to 5 nm thick. The gate dielectric can be formed simultaneously for the core CMOS transistors and the DE transistors or it can be separately formed using a split gate process. A gate layer 70 is formed on gate dielectric 60. Preferably, this gate layer is comprised of polycrystalline silicon ("poly" or "polysilicon"), but it may be comprised of epitaxial silicon or any other semiconducting material or metal. This polycrystalline material will be patterned and etched to define a transistor gate structure 72 and drain alignment structures 74 and 76 as shown in FIG. 3B. In an embodiment of the instant invention, the drain alignment structure 74, 76 can comprise a ring structure. The gate of the DE transistor 72 is positioned such that it overlaps the p-well implanted regions 130 and 131 and the n-well region 20. Sidewall spacer structures 75 are formed using silicon dioxide, silicon nitride or other similar materials. The spacers 75 are formed by first forming a blanket film on the surface of the substrate followed by an anisotropic etch. The sidewall spacers for the DE transistor 75 are formed simultaneously with the sidewall spacers of the core transistors. The drain and source regions of the DE transistor are defined by first forming a patterned photoresist film 81 as shown in FIG. 3C. This patterned film can be formed during the P+ source and drain pattern step for the core PMOS transistor. The alignment of this patterned resist film 81 to the gate and drain alignment structures 72, 74, and 76 is not critical since any misalignment that occurs will be compensated by the widths of the gate and drain alignment structures 72, 74, and 76. The DE transistor source 140 and drain 141 regions are then formed during the P+ implantation process to form the source and drain regions for the core PMOS transistor. The position of the source region is self-aligned to the edge of the gate structure 72 (including sidewall spacers 75) and the position of the drain is self-aligned by the drain alignment structures 74, 76 (including sidewall spacers 75). This alignment of the source and drain regions 140, 141 represents the second self-aligned step of the instant invention. Following the removal of the patterned photoresist film 81, the DE transistor is completed using standard semiconductor processing. In addition to the processes described above any number of additional implants could be added to the process. In some CMOS technologies pocket implants, channel stop implants, and punch through implants are used. One or more of these processes could be used in the fabrication of the DE transistor of the instant invention without departing from the scope of the instant invention. In the DE transistor structure shown in FIG. 3C, the p-well region 131 functions as the lightly doped drain extension region surrounding the heavily doped p-type drain region 141. The region 130 functions as a source extension region which surrounds the heavily doped p-type source region 140. This source extension region functions to reduce the electric field in regions of the gate 72 close to the source. The separation of the source region 140 and the drain region 141 is defined by the separation of the gate region 72 and the drain alignment structures 74 and 76. This separation will be controllable to within the limits of the photolithographic processes and the etch processes used to define the gate region 72 and drain alignment regions 74, 76.

Figure 4A:
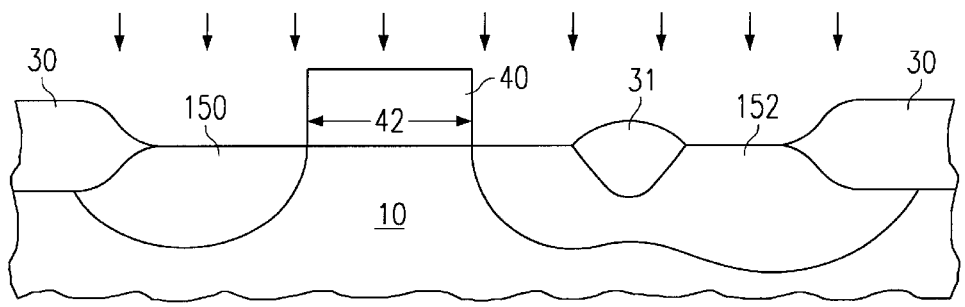
Figure 4B:
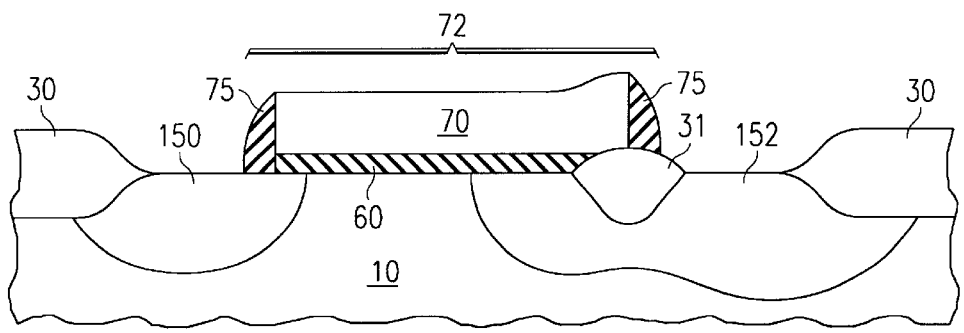
Figure 4C:
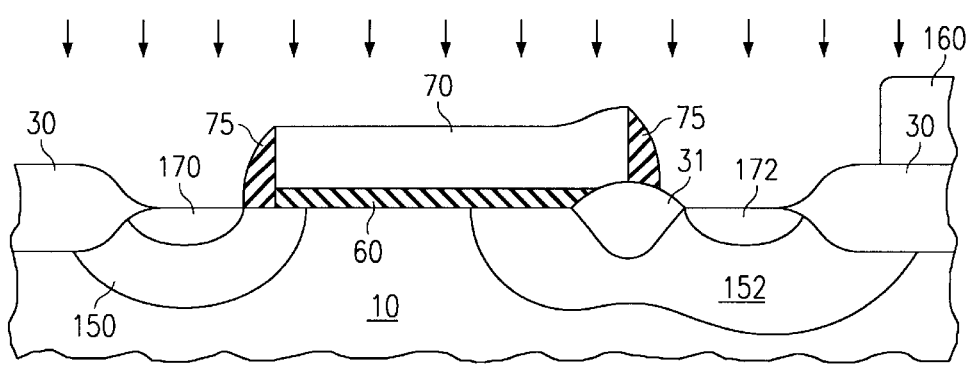
Figure 4D:
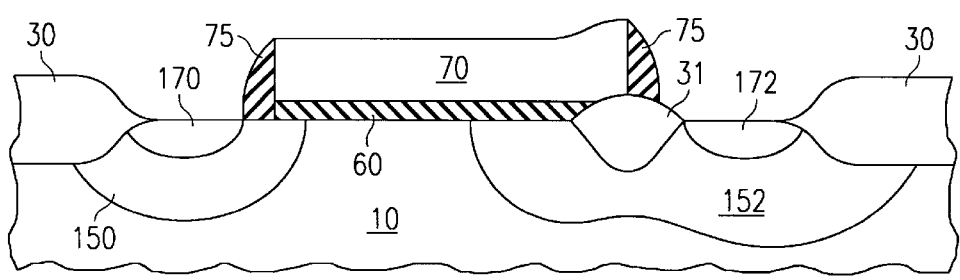

Shown in FIGS. 4A–4D are cross-sections of a DE-NMOS transistor fabrication process according to another embodiment of the instant invention. Here the silicon substrate will contain other CMOS transistors (not shown) fabricated in other region of the substrate. These CMOS transistors represent core transistors and can have operating voltages less than that of the DE transistors. The DE transistor represented in FIGS. 4A–4D will have an operating voltage greater than that of the core transistors. The DE transistor will be simultaneously fabricated with the core transistors using many of the same processes. The fabrication process of the DE transistor will be described with respect to the function of the particular process in the core transistor fabrication sequence. The structure shown in FIG. 4A is formed in an p-well region 10. The isolation structures 30, 31 are formed using LOCOS processing technology and comprises silicon oxide or other suitable dielectrics. The oxide thickness is about 4000–7000Å and the layout of the isolation structures 30, 31 shown in FIG. 4A is defined by the photolithographic process used during nitride film patterning. The core transistor fabrication process used here is a twin well process. This requires that an n-type region and a p-type region be formed in the substrate for fabrication of the core PMOS and NMOS transistors respectively. During the p-well formation for the core transistors, region 10 is formed. For a typical CMOS processes the p-well is formed by the implantation of any number of p-type dopant species into the substrate to form the p-well region 10. In an embodiment of the p-well process, boron ions are implanted at doses of $2\times10^{12}$ cm$^2$ to $7\times10^{13}$ cm$^2$ at energies of about 40 keV. Standard photolithographic processes can be used to define region 10. Following the formation of the p-well region 10, a masking layer 40 is formed to act as an implant mask during the subsequent implantation step. In an embodiment of the instant invention, a patterned photoresist film is used. Any film suitable for masking the subsequent implant process can be used. During the n-well formation for the core CMOS transistors, regions 150 and 152 are formed. For a typical CMOS processes, the n-well (and simultaneously regions 150 and 152) can be formed by implanting any number of n-type dopant species into the p-well substrate region 10. In one embodiment, this could comprise implantation of a phosphorous species at about $8\times10^{12}$ cm$^2$ to $7\times10^{13}$ cm$^2$ at an energy of about 150 keV. The width of the photoresist mask 42 defines the channel length of the DE transistor and can be controlled to an accuracy defined by the limits of the photolithographic process. The process of using a photolithographic mask to define the channel length of the transistor represents the first self-aligned process of the instant invention. Following the removal of the photoresist mask, a gate dielectric 60 is formed on the p-well region 10. The gate dielectric 60 may be comprised of an oxide, thermally grown SiO2, a nitride, an oxynitride, a silicate, or any combination thereof, and is preferably on the order of 1 to 5 nm thick. The gate dielectric can be formed simultaneously for the core CMOS transistors and the DE transistors or it can be separately formed using a split gate process. A gate layer 70 is formed on gate dielectric 60. Preferably, this gate layer is comprised of polycrystalline silicon ("poly" or "polysilicon"), but it may be comprised of epitaxial silicon or any other semiconducting material or metal. This polycrystalline material will be patterned and etched to define a transistor gate structure 72 as shown in FIG. 4B. The gate of the DE transistor 72 is positioned such that it overlaps the n-well implanted regions 150, 152, the p-well region 10, and a portion of the isolation region 31. Sidewall spacer structures 75 are formed using silicon dioxide, silicon nitride or other similar materials. The spacers 75 are formed by first forming a blanket film on the surface of the substrate followed by an anisotropic etch. The sidewall spacers for the DE transistor 75 are formed simultaneously with the sidewall spacers of the core transistors. The drain and source regions of the DE transistor are defined by first forming a patterned photoresist film 160 as shown in FIG. 4C. This patterned film can be formed during the N+ source and drain pattern step for the core NMOS transistor. The alignment of this patterned resist film 160 is not critical since any misalignment that occurs will be compensated by the isolation region 30. The DE transistor source region 170 and drain region 172 are then formed during the N+ implantation process used to form the source and drain regions for the core NMOS transistor as shown in FIG. 4C. The position of the source region is self-aligned to the edge of the gate structure 72 (including sidewall spacers 75) and the position of the drain is self-aligned by the isolation regions 30, 31. This alignment of the source and drain regions 170, 172 represents the second self-aligned step of the instant invention. Following the removal of the patterned photoresist film 160 as shown in FIG. 4D, the DE transistor is completed using standard semiconductor processing. In addition to the processes described above any number of additional implants could be added to the process. In some CMOS technologies pocket implants, channel stop implants, and punch through implants are used. One or more of these processes could be used in the fabrication of the DE transistor of the instant invention without departing from the scope of the instant invention. In the DE transistor structure shown in FIG. 4D, the n-well region 152 functions as the lightly doped drain extension region surrounding the heavily doped n-type drain region 172. The region 150 functions as a source extension region which surrounds the heavily doped n-type source region 170. This source extension region functions to reduce the electric field in regions of the gate 72 close to the source. The separation of the source region 170 and the drain region 172 is defined by the separation of the gate region 72 and the isolation region 31. This separation will be controllable to within the limits of the photolithographic processes and the etch processes used to define the gate region 72.

Figure 5A:
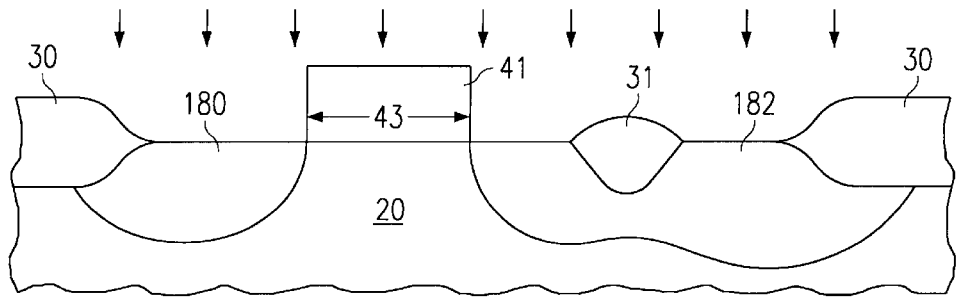
Figure 5B:
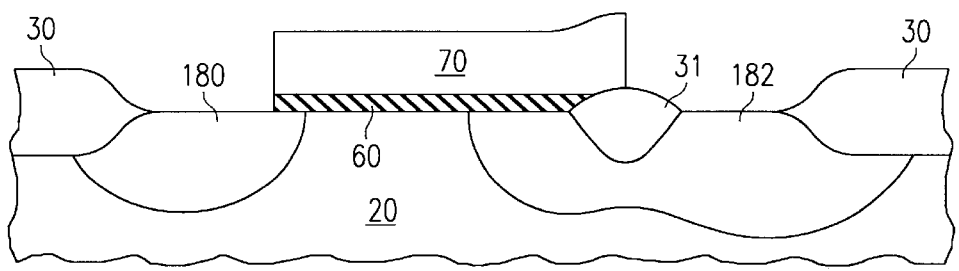
Figure 5C:
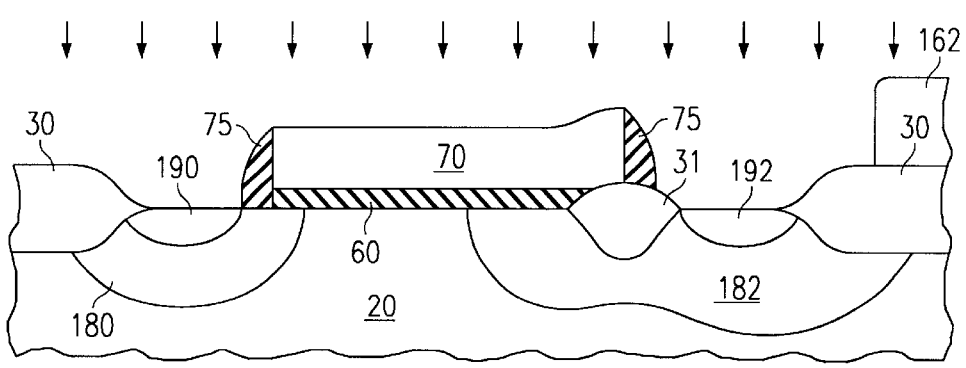
Figure 5D:
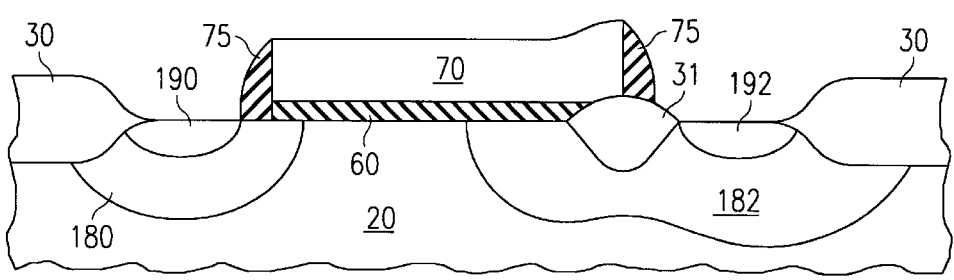

Shown in FIGS. 5A–5D are cross-sections of a DE-NMOS transistor fabrication process according to another embodiment of the instant invention. Here the silicon substrate will contain other CMOS transistors (not shown) fabricated in other region of the substrate. These CMOS transistors represent core transistors and can have operating voltages less than that of the DE transistors. The DE transistor represented in FIGS. 5A–5D will have an operating voltage greater than that of the core transistors. The DE transistor will be simultaneously fabricated with the core transistors using many of the same processes. The fabrication process of the DE transistor will be described with respect to the function of the particular process in the core transistor fabrication sequence. The structure shown in FIG. 5A is formed in an n-well region 20. The isolation structures 30, 31 are formed using LOCOS processing technology and comprises silicon oxide or other suitable dielectrics. The oxide thickness is about 4000–7000Å and the layout of the isolation structures 30, 31 shown in FIG. 5A is defined by the photolithographic process used during nitride film patterning. The core transistor fabrication process used here is a twin well process. This requires that an n-type region and a p-type region be formed in the substrate for fabrication of the core PMOS and NMOS transistors respectively. During the n-well formation for the core transistors, region 20 is formed. For a typical CMOS processes the n-well is formed by the implantation of any number of n-type dopant species into the substrate to form the n-well region 20. In an embodiment of the n-well process, phosphorous ions are implanted at doses of $2 \times 10^{12}$ cm$^2$ to $7 \times 10^{13}$ cm$^2$ at energies of about 150 keV. Standard photolithographic processes can be used to define region 20. Following the formation of the n-well region, a masking region 41 is formed to act as an implant mask during the subsequent implantation step. In an embodiment of the instant invention, a patterned photoresist film is used. Any film suitable for masking the subsequent implant process can be used. During the p-well formation for the core CMOS transistors, regions 180 and 182 are formed. For a typical CMOS processes, the p-well (and simultaneously regions 180 and 182) can be formed by implanting any number of p-type dopant species into the substrate. In one embodiment, this could comprise implantation of a boron species at about $8 \times 10^{12}$ cm$^2$ to $7 \times 10^{13}$ cm$^2$ at an energy of about 40 keV. The width of the photoresist mask 43 defines the channel length of the DE transistor and can be controlled to an accuracy defined by the limits of the photolithographic process. The process of using a photolithographic mask to define the channel length of the transistor represents the first self-aligned process of this embodiment of the instant invention. Following the removal of the photoresist mask, a gate dielectric 60 is formed on the n-well region 20. In an embodiment of the instant invention, the gate dielectric 60 may be comprised of an oxide, thermally grown SiO2, a nitride, an oxynitride, a silicate or any combination thereof, and is preferably on the order of 1 to 5 nm thick. The gate dielectric can be formed simultaneously for the core CMOS transistors and the DE transistors or it can be separately formed using a split gate process. A gate layer 70 is formed on the gate dielectric 60. Preferably, this gate layer is comprised of polycrystalline silicon ("poly" or "polysilicon"), but it may be comprised of epitaxial silicon or any other semiconducting material or metal. This polycrystalline material will be patterned and etched to define a transistor gate structure 72 and drain alignment structures 74 and 76 as shown in FIG. 5B. The gate of the DE transistor 72 is positioned such that it overlaps the p-well implanted regions 180 and 182, the n-well region 20, and a portion of the isolation region 31. Sidewall spacer structures 75 are formed using silicon dioxide, silicon nitride or other similar materials. The spacers 75 are formed by first forming a blanket film on the surface of the substrate followed by an anisotropic etch. The sidewall spacers for the DE transistor 75 are formed simultaneously with the sidewall spacers of the core transistors. The drain and source regions of the DE transistor are defined by first forming a patterned photoresist film 182 as shown in FIG. 5C. This patterned film can be formed during the P+ source and drain pattern step for the core PMOS transistor. The alignment of this patterned resist film 162 is not critical since any misalignment that occurs will be compensated by isolation region. The DE transistor source 190 and drain 192 regions are then formed during the P+ implantation process to form the source and drain regions for the core PMOS transistor. The position of the source region is self-aligned to the edge of the gate structure 72 (including sidewall spacers 75) and the position of the drain is self-aligned by the isolation structure 31. This alignment of the source and drain regions 190, 192 represents the second self-aligned step of the instant invention. Following the removal of the patterned photoresist film 162 as shown in FIG. 5D, the DE transistor is completed using standard semiconductor processing. In addition to the processes described above any number of additional implants could be added to the process. In some CMOS technologies pocket implants, channel stop implants, and punch through implants are used. One or more of these processes could be used in the fabrication of the DE transistor of the instant invention without departing from the scope of the instant invention. In the DE transistor structure shown in FIG. 5D, the p-well region 182 functions as the lightly doped drain extension region surrounding the heavily doped p-type drain region 192. The region 180 functions as a source extension region which surrounds the heavily doped p-type source region 190. This source extension region functions to reduce the electric field in regions of the gate 72 close to the source. The separation of the source region 190 and the drain region 192 is defined by the separation of the gate region 72 and the isolation structure 31. This separation will be controllable to within the limits of the photolithographic processes and the etch processes used to define the gate region 72.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method for forming a drain extension transistor, comprising:

providing a semiconductor substrate with a plurality of isolation structures and a first well region of a first conductivity type;

forming a masking layer on a first area of said first well region;

implanting said first well region to form regions of a second conductivity type in said first well region adjacent to said masking layer;

removing said masking region;

forming a gate dielectric on said first well region;

forming a gate layer on said gate dielectric;

patterning said gate layer to form a gate structure and drain alignment structures such that said gate structure overlies a portion of said first well region and a portion of said regions of said second conductivity type;

forming a patterned film to mask an area between said gate structure and said drain alignment structures; and simultaneously forming a source region and a drain region in said regions of said second conductivity type.

2. The method of claim 1 wherein said plurality of isolation structures are LOCOS.

3. The method of claim 1 wherein said plurality of isolation structures are shallow trench isolation.

4. The method of claim 1 wherein said masking layer comprises photoresist.

5. The method of claim 1 wherein said gate dielectric comprises a material selected from the group consisting of an oxide, thermally grown SiO2, a nitride, an oxynitride, a silicate, and any combination thereof.

6. The method of claim 1 wherein said source and drain region is of a second conductivity type.

7. A method for forming a drain extension transistor, comprising:

provinding a semiconductor substrate with a plurality of isolation structures and a first well region of a first conductivity type;

forming a masking layer on a first area of said first well region;

implanting said first well region to form regions of a second conductivity type in said first well region adjacent to said masking layer;

removing said masking region;

forming a gate dielectric on said first well region;

forming a gate layer on said gate dielectric;

patterning said gate layer to form a gate structure such that said gate structure overlies a portion of said first well region and a portion of said regions of said second conductivity type and a portion of at least one of said isolation structures; and simultaneously forming a source region and a drain region in said regions of said second conductivity type.

8. The method of claim 7 wherein said plurality of isolation structures are LOCOS.

9. The method of claim 7 wherein said plurality of isolation structures are shallow trench isolation.

10. The method of claim 7 wherein said masking layer comprises photoresist.

11. The method of claim 7 wherein said gate dielectric comprises a material selected from the group consisting of an oxide, thermally grown SiO2, a nitride, an oxynitride, a silicate, and any combination thereof.

12. The method of claim 7 wherein said source and drain region is of a second conductivity type.

* * * * *